United States Patent
Nilsson et al.

(10) Patent No.: US 8,638,143 B2
(45) Date of Patent: Jan. 28, 2014

(54) PHASE LOCKED LOOP FREQUENCY SYNTHESIZER CIRCUIT WITH IMPROVED NOISE PERFORMANCE

(75) Inventors: Magnus Nilsson, Lund (SE); Nikolaus Klemmer, Plano, TX (US)

(73) Assignee: ST-Ericsson SA, Plan-les-Ouates (CH)

( * ) Notice: Subject to any disclaimer, the term of this patent is extended or adjusted under 35 U.S.C. 154(b) by 59 days.

(21) Appl. No.: 13/511,603

(22) PCT Filed: Nov. 16, 2010

(86) PCT No.: PCT/EP2010/067557
§ 371 (c)(1),
(2), (4) Date: May 23, 2012

(87) PCT Pub. No.: WO2011/064122
PCT Pub. Date: Jun. 3, 2011

(65) Prior Publication Data
US 2012/0274372 A1    Nov. 1, 2012

Related U.S. Application Data

(60) Provisional application No. 61/311,901, filed on Mar. 9, 2010.

(30) Foreign Application Priority Data

Nov. 24, 2009    (EP) .................................. 09176834

(51) Int. Cl.
*H03L 7/06* (2006.01)
(52) U.S. Cl.
USPC .......................................... 327/157; 327/148

(58) Field of Classification Search
USPC ................................. 327/148, 157; 375/374
See application file for complete search history.

(56) References Cited

U.S. PATENT DOCUMENTS

| | | | |
|---|---|---|---|
| 5,703,511 A | 12/1997 | Okamoto | |
| 6,611,160 B1 * | 8/2003 | Lee et al. | 327/157 |
| 6,812,754 B1 * | 11/2004 | Nakanishi | 327/157 |
| 2008/0100352 A1 | 5/2008 | Park | |

FOREIGN PATENT DOCUMENTS

EP    1292032 A1    3/2003

* cited by examiner

*Primary Examiner* — Hai L Nguyen
(74) *Attorney, Agent, or Firm* — Coats and Bennett PLLC

(57) ABSTRACT

A phase locked loop frequency synthesizer comprises a voltage controlled oscillator; a loop filter for supplying a control voltage to the oscillator; a phase frequency detector arranged to detect a phase difference between a reference signal and a feedback signal generated from the oscillator signal and generate pulses on detector signals (UP/DN) dependent on the sign of the phase difference; and a charge pump (61) comprising current generating means and controlled switches (64, 65) arranged to convert pulses on the detector signals to current pulses from a reference voltage (Vdd') to a common terminal (Vloop) connected to the loop filter or to current pulses from the common terminal to ground. The current generating means comprises at least one resistor (62, 63) connected between the common terminal and the switches, and the charge pump comprises an operational amplifier (66) coupled to keep the reference voltage at twice the voltage at the common terminal.

10 Claims, 4 Drawing Sheets

PHASE LOCKED LOOP FREQUENCY SYNTHESIZER CIRCUIT WITH IMPROVED NOISE PERFORMANCE

TECHNICAL FIELD

The invention relates to wireless communication systems and especially to phase locked loop frequency synthesizer circuits with stringent noise requirements. The invention also relates to a method of generating an oscillator output signal in a phase locked loop frequency synthesizer circuit.

BACKGROUND

Frequency spectrum is a scarce resource and future communication system tries to utilize the available spectra more efficiently. One example of this is Wideband Code-Division Multiple Access (WCDMA), where the original system was using QPSK (Quadrature Phase-Shift Keying) modulation, generating 2 bits/Hz. The latest version of the WCDMA, eHSPA (High-Speed Packet Access), uses 64 QAM (Quadrature Amplitude Modulation) to get 6 bits/Hz. Future communication systems will use even higher order modulation (up to 1024 QAM is discussed already now). To maximize the usable data throughput, very low coding overhead is used. To be able to detect the signal without bit errors, the imperfections in the radio needs to be very small. The imperfections include thermal noise, IQ phase and gain mismatch, dc offsets, Local Oscillator phase noise and digital quantization noise. This invention discusses the Local Oscillator phase noise part, which could be a dominating part of the imperfections.

Most modern transceiver solutions use direct conversion receiver and transmitter architectures to reduce complexity and minimize power consumption. Such transceivers use local oscillators responsible for frequency generation in the receiver as well as in the transmitter. The phase noise of the local oscillator signal will be superimposed on the receive/transmit signal and degrade the signal quality. Since the receiver will filter the received signal before entering the detector, only the phase noise within $+-f_{ch}/2$ is of interest, where $f_{ch}$ is the bandwidth of each channel.

The local oscillator output has to be a clean low noise signal to get good quality reception/transmission. This is normally achieved by locking an LC-oscillator to a crystal oscillator using a phase locked loop. The LC-oscillator needs to cover all desired RF RX/TX frequencies. The phase locked loop is typically delta-sigma controlled, and includes a crystal oscillator, a phase frequency detector, a charge pump, a loop filter, a voltage controlled oscillator, a frequency divider and a delta-sigma modulator.

Studies of the noise properties of a delta-sigma controlled phase locked loop show that the charge pump is one of the dominating imperfections in the phase locked loop. The charge pump imperfections can be divided into two noise contributors:

Thermal noise and 1/f noise.
Noise problems due to nonlinear transfer function of input phase to output charge. This nonlinearity will cause folding of the high pass filtered delta-sigma quantization noise into in-band phase locked loop noise.

Normally, the charge pump is implemented using MOS current sources. To get good repeatability of the phase locked loop bandwidth, the current is generated using a band gap reference. The band gap reference is used to generate a reference voltage insensitive to temperature and supply voltage. This voltage is then converted into a current using a resistor. Finally it is scaled to the desired output current in a ratioed current mirror. By using a programmable current setting resistor and programmable frequency divider, the phase locked loop dynamics can be controlled. Finally, the charge pump is controlled from the phase detector using UP and DOWN signals.

When using a charge pump in a delta-sigma controlled phase locked loop, it is critical to have good matching between the sink and source current sources. Otherwise the phase locked loop noise performance will suffer.

When implementing such a charge pump, several tradeoffs have to be made. First of all, the solution is inherently noisy, since a lot of noise sources are present. Noise can be improved at a current cost.

Also, when implementing the current sources in a deep CMOS process, nmos-pmos-devices are used to implement the current sources. To get good matching between the sink and source current pulses, the mos current sources have to be sized large.

Also, since the output voltage will be varying, the output impedance of the current sources needs to be high. This calls for long devices/cascoding. It is difficult to cover a wide loop voltage range with good sink/source matching.

The above problems call for large sized devices, which will cost current to drive. A worse problem is that it causes slow rise/fall times and in particular mismatch between sink and source rise and fall times, since different devices are used (nmos vs. pmos). This also causes delta-sigma noise folding, which degrades phase locked loop noise performance further.

There is a need for a fast, well-matched and low noise charge pump.

An article, Brownlee et al "A 0.5 to 2.5 GHz PLL with Fully Differential Supply-Regulated Tuning", Proc. ISSCC 2006, pp. 588-589, addresses the charge pump noise problem by using a ring oscillator VCO with differential tuning input, which is not the case with an LC-based VCO. This solution suggests a way of generating a "charge-pump" current via resistors by connecting them to a mid-reference common-mode, virtual ground node. It requires two loop filters, of which one is an active loop filter, which incurs an operational amplifier in the signal path and further degrades noise. The use of an operational amplifier in the loop filter probably degrades noise more than what is gained by using resistors. Further, the use of two loop filters doubles loop filter noise and area.

SUMMARY

Therefore, it is an object of embodiments of the invention to provide a phase locked loop frequency synthesizer circuit having an improved noise performance.

According to embodiments of the invention the object is achieved in a phase locked loop frequency synthesizer circuit comprising a voltage controlled oscillator for generating an oscillator output signal; a loop filter with a capacitor for supplying a control voltage to the voltage controlled oscillator; a phase detector arranged to detect a phase difference between a reference signal and a feedback signal generated from said oscillator output signal, and to generate pulses on one of a first detector signal and a second detector signal in dependence of the sign of said detected phase difference; and a charge pump circuit comprising current generating means and two controlled switches arranged to convert pulses on the first detector signal to current pulses from a reference voltage to a common terminal connected to the capacitor of the loop filter and pulses on the second detector signal to current pulses from said common terminal to ground. The object is achieved in that said current generating means comprises at least one resistor connected between said common terminal and said controlled switches, and that the charge pump circuit further comprises an operational amplifier coupled as a non-inverting amplifier, wherein the output of the operational amplifier is connected to the reference voltage, the inverting input is connected to a midpoint of two equal sized feedback resistors connected between the reference voltage and ground, and the non-inverting input is connected to said common terminal, so that the reference voltage is kept at twice the voltage at the common terminal.

By connecting the common terminal, i.e. the output from the charge pump to the loop filter, through a resistor having a given resistance and one of the switches (UP/DOWN) controlled by the phase frequency detector to either ground (through the DOWN switch) or a voltage that is kept at twice the voltage at the common terminal (through the UP switch), it is ensured that the sink and source current pulses are well matched and thus that the noise performance is improved.

In one embodiment the current generating means comprises two equal sized resistors, each resistor being connected between said common terminal and one of said controlled switches. "Equal sized" should here be understood such that the two resistors do not differ more than one or a few percent from each other. This solution is suitable in circuits where the UP and DOWN switches may be controlled to be closed simultaneously. Alternatively, when this is not the case, a solution with one common resistor can be used.

The voltage controlled oscillator may be an LC resonator comprising an inductor and a fixed capacitive ladder in parallel with a variable capacitor with continuous tuning.

The circuit may further comprise a precharging circuit arranged to precharge said common terminal to a predetermined voltage before tuning the circuit to a desired frequency of the oscillator output signal. In that case, the circuit may be configured to precharge said common terminal to a predetermined voltage; determine a setting of the capacitive ladder resulting in a frequency of the oscillator output signal closest to the desired frequency; and continue with normal phase locking of the circuit to obtain the desired frequency.

As mentioned, some embodiments of the invention also relate to a method of generating an oscillator output signal in a phase locked loop frequency synthesizer circuit comprising a voltage controlled oscillator; a loop filter with a capacitor for supplying a control voltage to the voltage controlled oscillator; a phase detector arranged to detect a phase difference between a reference signal and a feedback signal generated from said oscillator output signal, and to generate pulses on one of a first detector signal and a second detector signal in dependence of the sign of said detected phase difference; and a charge pump circuit comprising current generating means and two controlled switches arranged to convert pulses on the first detector signal to current pulses from a reference voltage to a common terminal connected to the capacitor of the loop filter and pulses on the second detector signal to current pulses from said common terminal to ground. The method comprises the steps of using at least one resistor connected between said common terminal and said controlled switches for converting the pulses on the first and second detector signal to current pulses in said current generating means, and keeping the reference voltage at twice the voltage at the common terminal by an operational amplifier coupled as a non-inverting amplifier, wherein the output of the operational amplifier is connected to the reference voltage, the inverting input is connected to a midpoint of two equal sized feedback resistors connected between the reference voltage and ground, and the non-inverting input is connected to said common terminal.

Embodiments corresponding to those mentioned above for the circuit also apply for the method.

BRIEF DESCRIPTION OF THE DRAWINGS

Embodiments of the invention will now be described more fully below with reference to the drawings, in which.

DETAILED DESCRIPTION OF EMBODIMENTS

Figure 1:
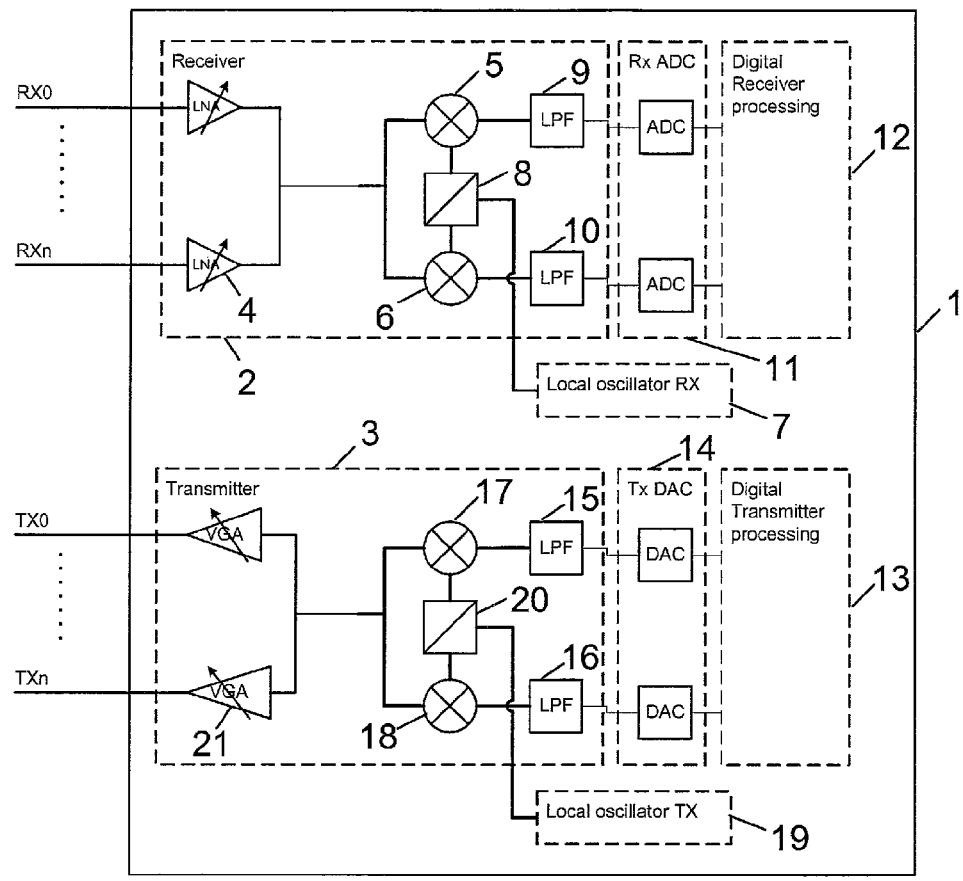
FIG. 1 shows a block diagram of an RF transceiver in which the invention can be used.

FIG. 1 shows a block diagram of a typical RF transceiver 1 in which the invention can be used. The transceiver 1 has a receiver part 2 and a transmitter part 3. Most modern transceiver solutions use direct conversion receiver and transmitter architectures to reduce complexity and minimize power consumption. The receiver and the transmitter need quadrature local oscillator signals.

Thus in the receiver 2 the received signals are fed from low noise amplifiers 4 to mixers 5, 6 in which the received information is translated to baseband frequency by mixing the received signals with quadrature local oscillator signals. These are normally generated by dividing a local oscillator signal from a local oscillator 7 responsible for frequency generation by a factor 2 or a higher even multiple in the divider 8. Thus the local oscillator signal should preferably be operating at twice (or a higher even multiple) the desired RX frequency. The two outputs from the mixers 5, 6 are an in-phase component and a quadrature component, and they are low pass filtered in the filters 9 and 10 before they are converted to digital values in the analog-to-digital converter unit 11 and further processed in the baseband processing stages 12.

Similarly, in the transmitter part signals from the processing stages 13 are converted in the digital-to-analog converter unit 14 and filtered in filtered in filters 15, 16 before they are mixed to radio frequencies in the mixers 17, 18 and fed to amplifiers 21. Again, the quadrature local oscillator signals are generated by dividing a local oscillator signal from a local oscillator 19 responsible for frequency generation by a factor 2 or a higher even multiple in a divider 20.

The output from local oscillators 7 and 19 has to be a clean low noise signal to get good quality reception/transmission. This is normally done by locking an LC-oscillator to a crystal oscillator using a phase locked loop. The LC-oscillator needs to cover all desired receive and transmit radio frequencies.

Figure 2:
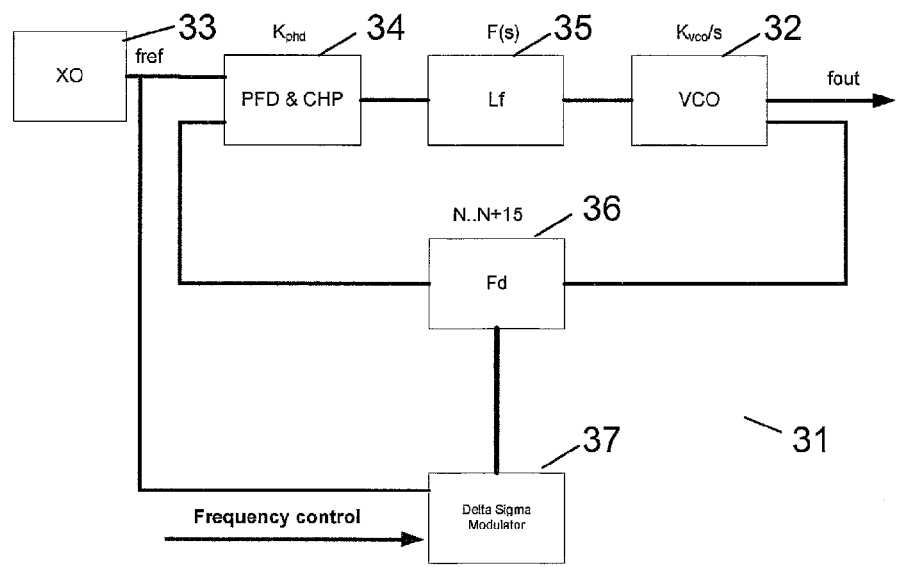
FIG. 2 shows a block diagram of a phase locked loop with a charge pump.

A block diagram of a typical phase locked loop 31 is depicted in FIG. 2, where the LC-oscillator 32 is locked to the crystal oscillator 33. In a phase frequency detector and charge pump 34 the phase of the feedback signal is compared to the phase of the reference signal from the crystal oscillator 33. If the phase of the feedback signal is behind that of the reference signal a short UP signal is generated, which in the charge pump is converted to a positive current pulse into a capacitor of the loop filter 35. Likewise, if the phase of the feedback signal is ahead that of the reference signal a short DOWN signal is generated, which in the charge pump is converted to a negative current pulse drawn from the loop filter 35. In a dead band, where the phases of the reference and feedback signals are equal or close to each other, the detector will fire either both or neither of the charge pumps with no effect on the loop filter 35. The voltage of the loop filter 35 in turn controls the frequency of the voltage controlled LC-oscillator 32. The feedback path of the fractional-N phase locked loop comprises a frequency divider 36 and optionally a fractional controller (delta sigma modulator) 37 to ensure that the generated output frequency from the voltage controlled LC-oscillator 32 is divided appropriately to be compared with the reference signal in the phase frequency detector.

Studies of the noise properties of a delta-sigma controlled phase locked loop as depicted in FIG. 2 have shown that the charge pump is one of the dominating imperfections in the phase locked loop. The charge pump imperfections can be divided into two noise contributors:

Thermal noise and 1/f noise.

Noise problems due to nonlinear transfer function of input phase to output charge. This nonlinearity will cause folding of the high pass filtered delta-sigma quantization noise into in-band phase locked loop noise.

Figure 3:
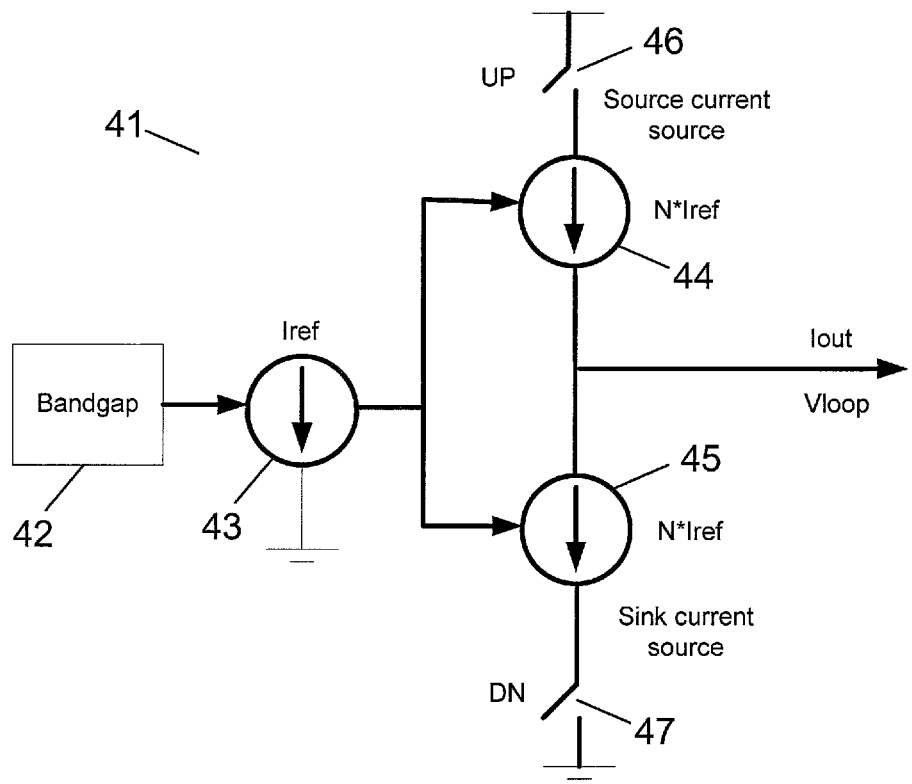
FIG. 3 shows an example of a known charge pump using MOS current sources.

Normally the charge pump is implemented using MOS current sources. To get good repeatability of the phase locked loop bandwidth, the current is generated using a band gap reference. A block diagram of a typical charge pump 41 is depicted in FIG. 3.

A reference circuit 42 is used to generate a reference voltage insensitive to temperature and supply voltage. This voltage is then converted into a current Iref using a resistor in the current generator 43. Finally it is scaled to the desired output current in a ratioed current mirror comprising the two current generators 44 and 45 for the positive and negative current pulses, respectively. The current pulses are supplied to or drawn from the loop filter. By using a programmable current setting resistor and programmable N, the dynamics of the phase locked loop can be controlled. Finally, the charge pump is controlled from the phase detector using the signals UP/DN as it was described above and illustrated with the switches 46 and 47.

Studies have shown that, when using a charge pump in a delta-sigma controlled phase locked loop, it is critical to have good matching between the sink and source current sources. Otherwise the phase locked loop noise performance will suffer.

Figure 4:
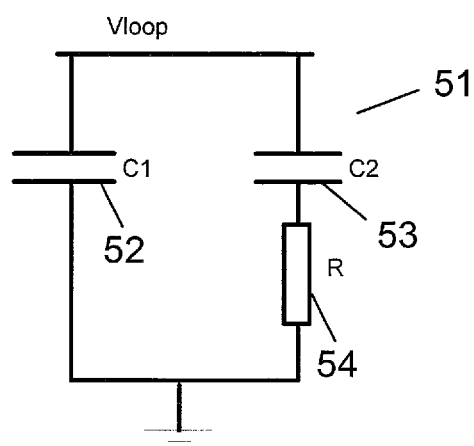
FIG. 4 shows an example of a loop filter for use in a phase locked loop.

An illustration of a simple loop filter 51 is shown in FIG. 4, comprising a first capacitor 52 and a second capacitor 53 in series with a resistor 54. More complex filtering can also be used. The main purpose of the filter is to integrate the charge pulses from the charge pump, but also to stabilize the phase locked loop. Thus the voltage Vloop over the loop filter equals the output voltage of the charge pump and this is the voltage controlling the frequency of the voltage controlled LC-oscillator.

When implementing a charge pump as shown in FIG. 3, several tradeoffs have to be made. First of all, the solution is inherently noisy, since a lot of noise sources are present. Noise can be improved at the expense of power consumption.

Also, when implementing the current sources in a deep submicron CMOS process, nmos- and pmos-devices are used to implement the current sources. To get good matching between the sink and source current pulses, the MOS current sources have to be sized physically large.

Also, since the output voltage will be varying, the output impedance of the current sources needs to be high. This calls for long devices/cascoding. It is difficult to cover a wide loop voltage range with good sink/source matching, and UP/DOWN current mismatch is a major noise source in fractional-N phase locked loops.

The above issues call for large sized devices, which will increase the drive current for the charge pump devices. A worse problem is that it causes slow rise/fall times and in particular mismatch between sink and source rise and fall times, since different devices are used (nmos vs. pmos). This causes delta-sigma noise folding, which degrades phase locked loop noise performance.

Figure 5:
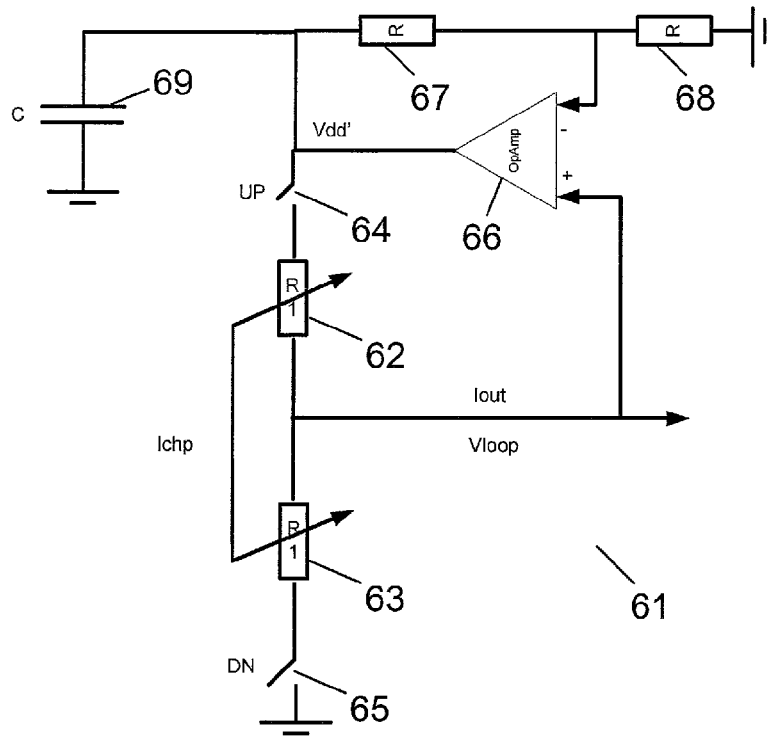
FIG. 5 shows a charge pump using equal sized resistors and an operational amplifier for keeping one of the reference voltages at twice the level of the VCO control voltage.

A different charge pump with improved linearity and low noise performance is described below. The basic block diagram of the charge pump 61 is shown in FIG. 5. The idea is to use two resistors 62 and 63 having the same value R1 instead of the current sources 44 and 45 of FIG. 3 to implement the charge pump. Resistors are less noisy than MOS devices and they do not generate 1/f-noise. Also it is easy to match the sink/source currents since they are generated using the same device. Thus the sink and source currents are now generated by switching a resistor either to ground or to a voltage Vdd' by means of one of the UP/DOWN switches 64 and 65. It is noted that although the resistors 62 and 63 are said to have the same value R1, tolerances of up to e.g. one or a few percent can be accepted.

The voltage Vdd' could be a fixed voltage such as the positive supply voltage. In this case the solution would minimize thermal noise, 1/f-noise, current consumption, switching speed & transients, and circuit complexity. However, it could also introduce UP/DOWN current mismatch, unless the locked VCO control voltage is exactly centered between the resistors' reference voltages (assumed to be e.g. supply voltage Vdd and GND). UP/DOWN current mismatch is also a major noise source in fractional-N phase locked loops.

Therefore, it is instead suggested to make one of the two reference voltages be the two times multiple of the VCO control voltage by virtue of an operational amplifier tracking loop. Thus FIG. 5 shows an operational amplifier 66 coupled as a non-inverting amplifier using two resistors 67 and 68 having the same value R. Again, tolerances of up to e.g. one or a few percent can be accepted. Since the non-inverting input of the operational amplifier 66 is connected to the charge pump output voltage Vloop, the output voltage of the operational amplifier 66 will be Vdd'=2*Vloop, and the sink and source currents will be well matched. The operational amplifier 66 together with the two matched feedback resistors 67 and 68 of value R will guarantee this.

The voltages Vdd' and Vloop should be kept stable during current pulses in order to achieve stable current pulses. To ensure this, a capacitor 69 is coupled across the Vdd' voltage, and further the loop filter, which is coupled to the Vloop voltage, is highly capacitive.

The capacitor 69 also has the functionality of band limiting the operational amplifier noise and stabilizing the operational amplifier feedback system. Thus the capacitor 69 has to be chosen high enough. Conversely, since the current amplitude is normally small, 10-100 uA, and the pulse lengths are short, ~1 ns, the current in the operational amplifier and the size of the capacitor 69 can be kept relatively small.

The resistors 62 and 63 can be fixed resistors, but as shown in FIG. 5 they may also be variable so that the output current magnitude can be controlled in order to maintain the bandwidth of the phase locked loop at a desired value, e.g. to compensate RC-product variations. Both resistors have to be varied simultaneously and to the same degree so that they continue to be approximately equal to each other.

Figure 6:
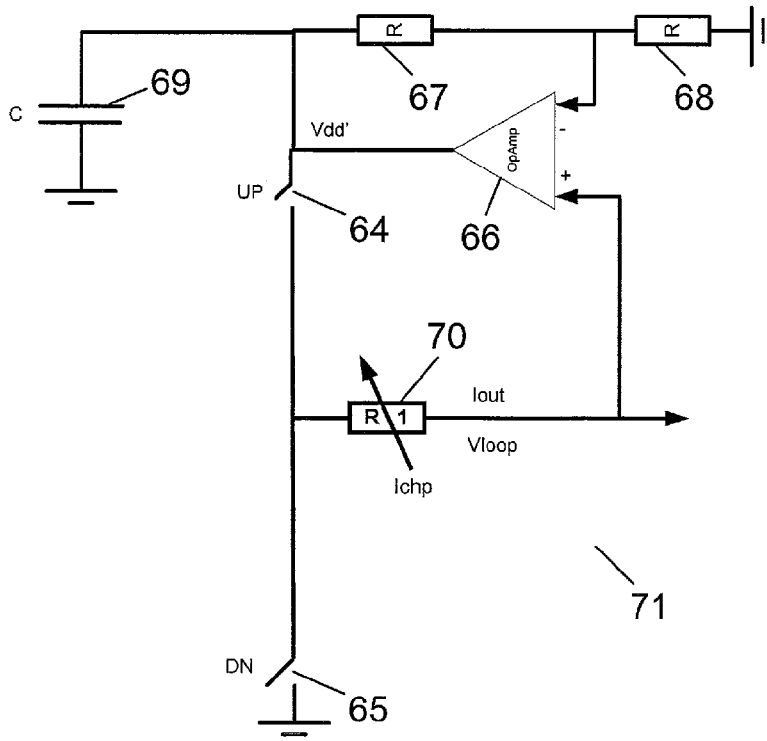
FIG. 6 shows a different embodiment of a charge pump using one common resistor.

Depending on the design of the phase frequency detector it may or may not occur that the two UP/DOWN switches 64 and 65 are closed simultaneously. In cases where the two switches can not be closed simultaneously, the two resistors 62 and 63 may be replaced by one single resistor that can be connected by one of the switches 64 and 65 to either the voltage Vdd' or to GND as required. This is illustrated in the charge pump 71 in FIG. 6, where the resistor 70 has replaced the two resistors 62 and 63. This reduces the current mismatch further, since the same resistor is used for both UP and DOWN current pulses. Thus only the tolerances of the matched feedback resistors 67 and 68 may lead to a small mismatch.

Figure 7:
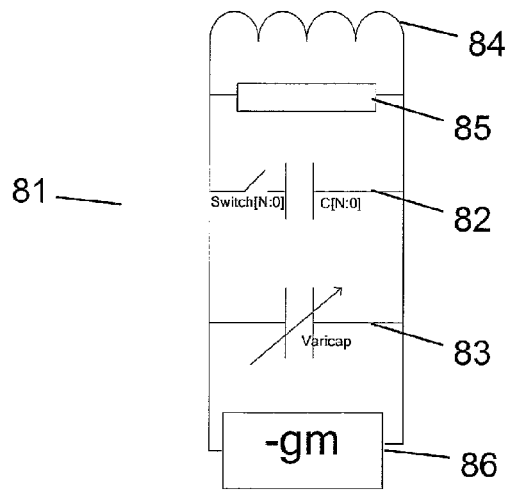
FIG. 7 shows a block diagram of an LC-resonator based VCO.

As mentioned above, the output voltage of the charge pump equals the voltage Vloop over the loop filter and this voltage also controls the frequency of the voltage controlled LC-oscillator. With this system, there is also a need to control Vloop. In running operation, it is controlled by the VCO centering. Normally an LC-resonator based VCO is used. An example block diagram of such a VCO 81 is shown in FIG. 7. The oscillator is tuned by a fixed capacitive ladder 82 in parallel with a variable capacitor (varicap) 83 with continuous tuning and an inductor 84. The resistor 85 represents all resonator losses and –gm is a sustaining amplifier 86.

Figure 8:
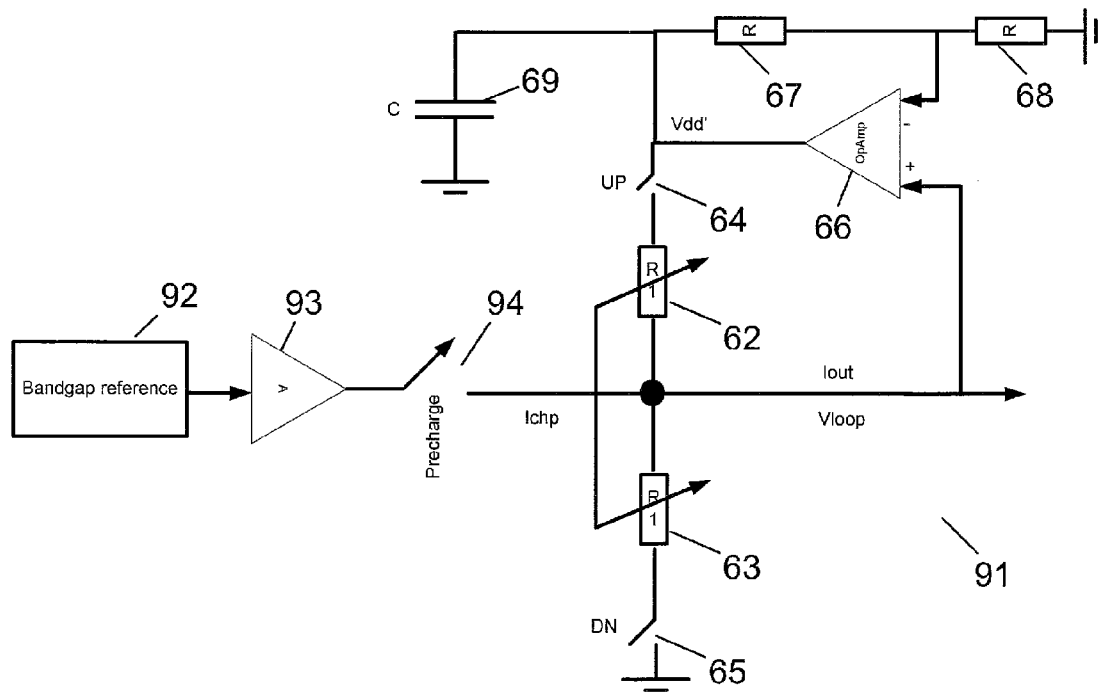
FIG. 8 shows a charge pump as the one in FIG. 5 with a precharging functionality added.

Locking of the phase locked loop then consists of 2 steps. First, the capacitive ladder is set to a value which generates a final loop voltage and then we continue with normal PLL locking. FIG. 8 shows a charge pump 91 as the one in FIG. 5, but with this precharging functionality added. The precharging circuitry comprises a reference voltage 92, an amplifier 93 and a precharging switch 94, An algorithm for locking the phase locked loop will then look like this:
  Enable the precharging functionality by closing the precharging switch 94 and disable the UP/DOWN signals.
  When the loop filter is precharged, enable an algorithm to find the capacitive ladder setting which returns the frequency which is closest to the desired one (for instance using a frequency counter).
    In parallel with this operation, Vdd' is locked to 2*Vloop as described above,
  Now release the precharge switch 94 and enable normal PLL locking. Vloop will now end up at the desired loop voltage and Vdd' will track 2*Vloop, as desired.

The charge pump described above shows improved performance resulting in improved noise performance of the phase locked loop, which in turn also leads to enhanced radio system throughput. Also, the current consumption can be kept at a minimum.

Although various embodiments of the present invention have been described and shown, the invention is not restricted thereto, but may also be embodied in other ways within the scope of the subject-matter defined in the following claims.

The invention claimed is:

1. A phase locked loop frequency synthesizer circuit comprising:
  a voltage controlled oscillator configured to generate an oscillator output signal;
  a loop filter including a capacitor, the loop filter being configured to supply a control voltage to the voltage controlled oscillator;
  a phase detector configured to detect a phase difference between a reference signal and a feedback signal generated from said oscillator output signal, and to generate pulses on one of a first detector signal and a second detector signal in dependence of the sign of said detected phase difference;
  a charge pump circuit comprising:
    two controlled switches configured to convert pulses on the first detector signal to be current pulses from a reference voltage to a common terminal connected to the capacitor of the loop filter, and to convert pulses on the second detector signal to be current pulses from said common terminal to ground; and
    a current generator comprising at least one first resistor connected between said common terminal and said controlled switches; and
  an operational amplifier coupled as a non-inverting amplifier, the operational amplifier comprising:
    an output connected to the reference voltage;
    an inverting input connected to a midpoint of two second, equal sized feedback resistors connected between the reference voltage and ground; and
    a non-inverting input connected to said common terminal, so that the reference voltage is kept at twice the voltage at the common terminal.

2. The phase locked loop frequency synthesizer circuit of claim 1, wherein the at least one first resistor of the current generator includes two equal sized resistors, each being connected between said common terminal and one of said controlled switches.

3. The phase locked loop frequency synthesizer circuit of claim 1, wherein the voltage controlled oscillator is an LC resonator comprising an inductor and a fixed capacitive ladder each connected in parallel to a variable capacitor with continuous tuning.

4. The phase locked loop frequency synthesizer circuit of claim 1, further comprising a precharging circuit configured to precharge said common terminal to a predetermined voltage before tuning the circuit to a desired frequency of the oscillator output signal.

5. The phase locked loop frequency synthesizer circuit of claim 4, wherein the circuit is configured to:
  precharge said common terminal to a predetermined voltage;
  determine a setting of the capacitive ladder resulting in a frequency of the oscillator output signal closest to the desired frequency; and
  continue with normal phase locking of the circuit to obtain the desired frequency.

6. A method of generating an oscillator output signal in a phase locked loop frequency synthesizer circuit comprising a voltage controlled oscillator; a loop filter with a capacitor for supplying a control voltage to the voltage controlled oscillator; a phase detector configured to detect a phase difference between a reference signal and a feedback signal generated from said oscillator output signal, and configured to generate pulses on one of a first detector signal and a second detector signal in dependence of the sign of said detected phase difference; and a charge pump circuit comprising a current generator and two controlled switches configured to convert pulses on the first detector signal to be current pulses from a reference voltage to a common terminal connected to the capacitor of the loop filter, and to convert pulses on the second detector signal to be current pulses from said common terminal to ground, the method comprising:

using at least one resistor connected between said common terminal and said controlled switches to convert the pulses on the first and second detector signal to current pulses in said current generator; and maintaining the reference voltage at twice the voltage at the common terminal by an operational amplifier coupled as a non-inverting amplifier, wherein the output of the operational amplifier is connected to the reference voltage, the inverting input is connected to a midpoint of two equal sized feedback resistors connected between the reference voltage and ground, and the non-inverting input is connected to said common terminal.

7. The method of claim 6, further comprising using two equal sized resistors, each being connected between said common terminal and one of said controlled switches, for converting the pulses on the first and second detector signal to current pulses in said current generator.

8. The method of claim 6, further comprising using an LC resonator comprising an inductor and a fixed capacitive ladder each connected in parallel to a variable capacitor with continuous tuning as the voltage controlled oscillator.

9. The method of claim 6, further comprising precharging said common terminal to a predetermined voltage before tuning the circuit to a desired frequency of the oscillator output signal.

10. The method of claim 9, further comprising:

precharging said common terminal to a predetermined voltage;

determining a setting of the capacitive ladder resulting in a frequency of the oscillator output signal closest to the desired frequency; and continuing with normal phase locking of the circuit to obtain the desired frequency.

* * * * *